US009396302B2

(12) United States Patent
Han et al.

(10) Patent No.: US 9,396,302 B2
(45) Date of Patent: Jul. 19, 2016

(54) GLOBAL ROUTER USING GRAPHICS PROCESSING UNIT

(71) Applicants: Yiding Han, Morrisville, NC (US); Koushik Chakraborty, Logan, UT (US); Sanghamitra Roy, Logan, UT (US)

(72) Inventors: Yiding Han, Morrisville, NC (US); Koushik Chakraborty, Logan, UT (US); Sanghamitra Roy, Logan, UT (US)

(73) Assignee: Utah State University, North Logan, UT (US)

( * ) Notice: Subject to any disclaimer, the term of this patent is extended or adjusted under 35 U.S.C. 154(b) by 0 days.

(21) Appl. No.: 14/505,374

(22) Filed: Oct. 2, 2014

(65) Prior Publication Data

US 2015/0095872 A1    Apr. 2, 2015

Related U.S. Application Data

(60) Provisional application No. 61/885,973, filed on Oct. 2, 2013.

(51) Int. Cl.
*G06F 17/50* (2006.01)

(52) U.S. Cl.
CPC .................. *G06F 17/5077* (2013.01)

(58) Field of Classification Search
USPC .......... 716/119, 123, 124, 125, 126, 129, 130
See application file for complete search history.

(56) References Cited

U.S. PATENT DOCUMENTS

| 8,201,130 B1* | 6/2012 | Kalman et al. ................ 716/126 |
| 2001/0009031 A1* | 7/2001 | Nitta .................... G06F 17/5077 716/129 |
| 2001/0018759 A1* | 8/2001 | Andreev et al. ................... 716/7 |

OTHER PUBLICATIONS

Han, Y. et al., A Global Router on GPU Architecture, 2013 IEEE 31st International Conference on Computer Design 78-84 (Oct. 6-9, 2013), IEEE.

\* cited by examiner

*Primary Examiner* — Brian Ngo

(57) ABSTRACT

For global routing using a graphics processing unit (GPU), a method routes a net of node interconnections for a semiconductor design. In addition, the method decomposes the net into subnets. Each subnet has no shared paths. The method further identifies a congested region of the routed net that exceeds routing capacities. In addition, the method correlates the congested region with a plurality of first subnets with workloads within the congested region. The method routes the subnets in parallel using the GPU.

17 Claims, 13 Drawing Sheets

270

| Element ID 275 | Reserved Status 280 | Subnet ID 215 |
|---|---|---|
| Element ID 275 | Reserved Status 280 | Subnet ID 215 |
| Element ID 275 | Reserved Status 280 | Subnet ID 215 |
| Element ID 275 | Reserved Status 280 | Subnet ID 215 |

GLOBAL ROUTER USING GRAPHICS PROCESSING UNIT

CROSS-REFERENCE TO RELATED APPLICATIONS

This application claims priority to U.S. Provisional Patent Application 61/885,973 entitled "GLOBAL ROUTER USING GRAPHICS PROCESSOR UNIT" and filed Oct. 2, 2013 for YiDing Han et al., the entire contents of which are incorporated herein by reference for all purposes.

GOVERNMENT RIGHTS

This invention was made with government support under National Science Foundation grants CNS-1117425, CAREER-1253024, and CCF-1318826. The government has certain rights in the invention.

FIELD

The subject matter disclosed herein relates to a global router and more particularly relates to a global router using a graphics processing unit (GPU).

BACKGROUND

Description of the Related Art

A global router is often used in semiconductor design to provide congestion analysis and to improve design routability. Unfortunately, the global router may require significant time to route a design.

BRIEF SUMMARY

A method for a global routing using a GPU is disclosed. The method routes a net of node interconnections for a semiconductor design. In addition, the method decomposes the net into subnets. Each subnet has no shared paths. The method further identifies a congested region of the routed net that exceeds routing capacities. In addition, the method correlates the congested region with a plurality of first subnets with workloads within the congested region. The method routes the subnets in parallel using the GPU.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1A:
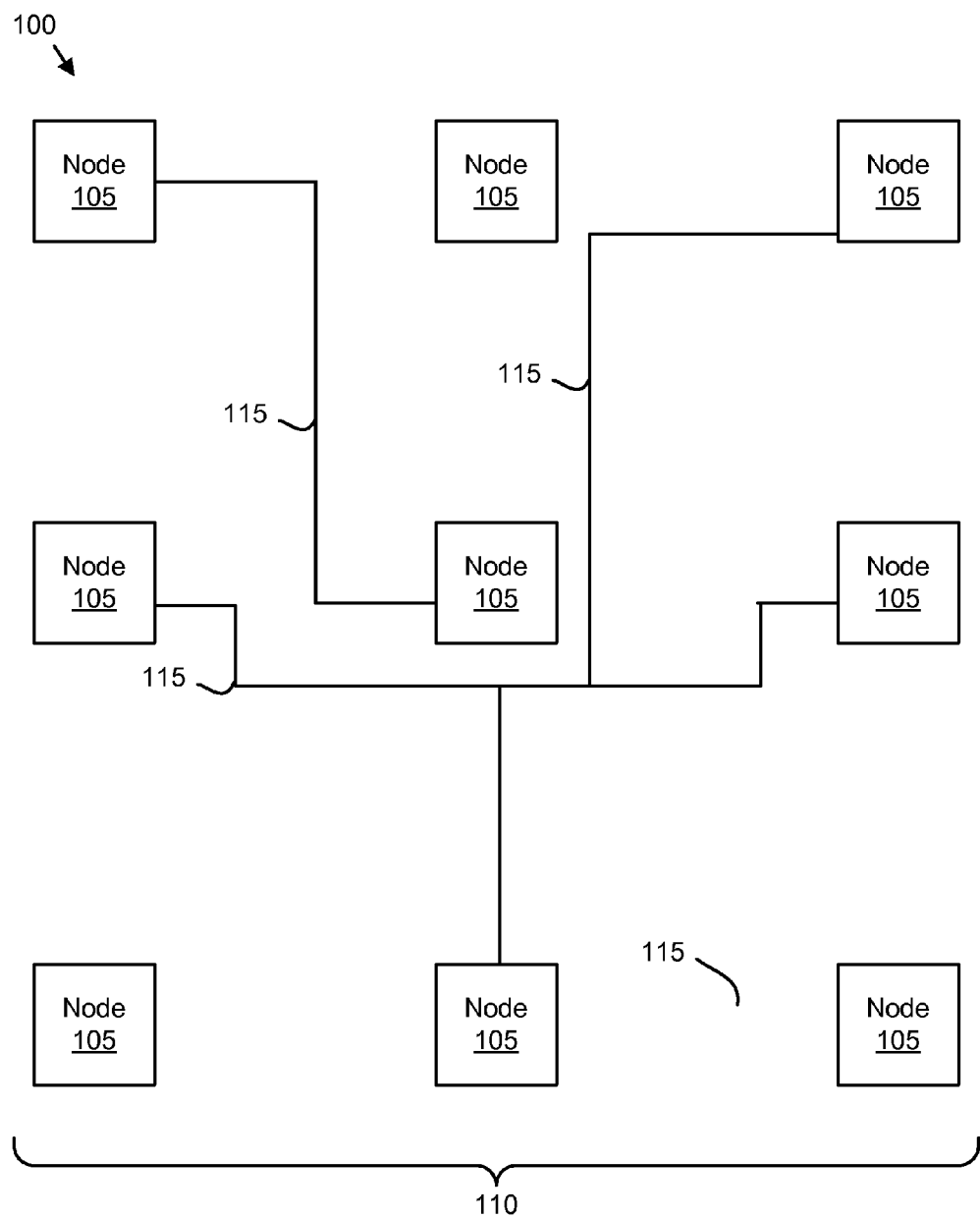
FIG. 1A is a schematic block diagram illustrating one embodiment of a routable system.

As will be appreciated by one skilled in the art, aspects of the embodiments may be embodied as a system, method or program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a program product embodied in one or more computer readable storage devices storing computer readable code. The storage devices may be tangible, non-transitory, and/or non-transmission.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in computer readable code and/or software for execution by various types of processors. An identified module of computer readable code may, for instance, comprise one or more physical or logical blocks of executable code which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of computer readable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different computer readable storage devices, and may exist, at least partially, merely as electronic signals on a system or network.

Where a module or portions of a module are implemented in software, the software portions are stored on one or more computer readable storage devices.

Any combination of one or more computer readable medium may be utilized. The computer readable medium may be a computer readable signal medium or a computer readable storage medium. The computer readable storage medium may be a storage device storing the computer readable code. The storage device may be, for example, but not limited to, an electronic, magnetic, optical, electromagnetic, infrared, holographic, micromechanical, or semiconductor system, apparatus, or device, or any suitable combination of the foregoing.

More specific examples (a non-exhaustive list) of the storage device would include the following: an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable code embodied therein, for example, in baseband or as part of a carrier wave. Such a propagated signal may take any of a variety of forms, including, but not limited to, electro-magnetic, optical, or any suitable combination thereof. A computer readable signal medium may be any storage device that is not a computer readable storage medium and that can communicate, propagate, or transport a program for use by or in connection with an instruction execution system, apparatus, or device. Computer readable code embodied on a storage device may be transmitted using any appropriate medium, including but not limited to wireless, wire line, optical fiber cable, Radio Frequency (RF), etc., or any suitable combination of the foregoing.

Computer readable code for carrying out operations for embodiments may be written in any combination of one or more programming languages, including an object oriented programming language such as Java, Smalltalk, C++ or the like and conventional procedural programming languages, such as the "C" programming language or similar programming languages. The computer readable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and program products according to embodiments. It will be understood that each block of the schematic flowchart diagrams and/or schematic block diagrams, and combinations of blocks in the schematic flowchart diagrams and/or schematic block diagrams, can be implemented by computer readable code. These computer readable code may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The computer readable code may also be stored in a storage device that can direct a computer, other programmable data processing apparatus, or other devices to function in a particular manner, such that the instructions stored in the storage device produce an article of manufacture including instructions which implement the function/act specified in the schematic flowchart diagrams and/or schematic block diagrams block or blocks.

The computer readable code may also be loaded onto a computer, other programmable data processing apparatus, or other devices to cause a series of operational steps to be performed on the computer, other programmable apparatus or other devices to produce a computer implemented process such that the program code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and program products according to various embodiments. In this regard, each block in the schematic flowchart diagrams and/or schematic block diagrams may represent a module, segment, or portion of code, which comprises one or more executable instructions of the program code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and computer readable code.

Descriptions of Figures may refer to elements described in previous Figures, like numbers referring to like elements.

FIG. 1A is a schematic block diagram illustrating one embodiment of a routable system 100. The system 100 may be a semiconductor design. The system 100 includes a plurality of nodes 105. For simplicity, nine nodes 105 are depicted. However, the routable system 100 may include any number of nodes 105. In certain embodiments, the number of nodes 105 is very large. The nodes 105 may be cores, circuit elements, input/output (I/O) modules, custom designs, or the like. Subnets 115 may connect the nodes 105. Together, the subnets 115 form a net 110.

The subnets 115 are routed in order to implement the semiconductor design in the routable system 100. Unfortunately, routing numerous subnets 115 requires substantial computing resources. The routing complexity may increase exponentially with the number of subnets 115. As a result, implementing a design on the routable system 100 may take considerable time.

The embodiments described herein organize the subnets 115 for greater concurrency in order to route the subnets 115 in parallel using a GPU. By parallelizing the routing of the subnets 115, the embodiments significantly accelerate the routing of the routable system 100. Han, Yiding, et al. "A Global Router on GPU Architecture" is incorporated herein in its entirety.

Figure 1B:
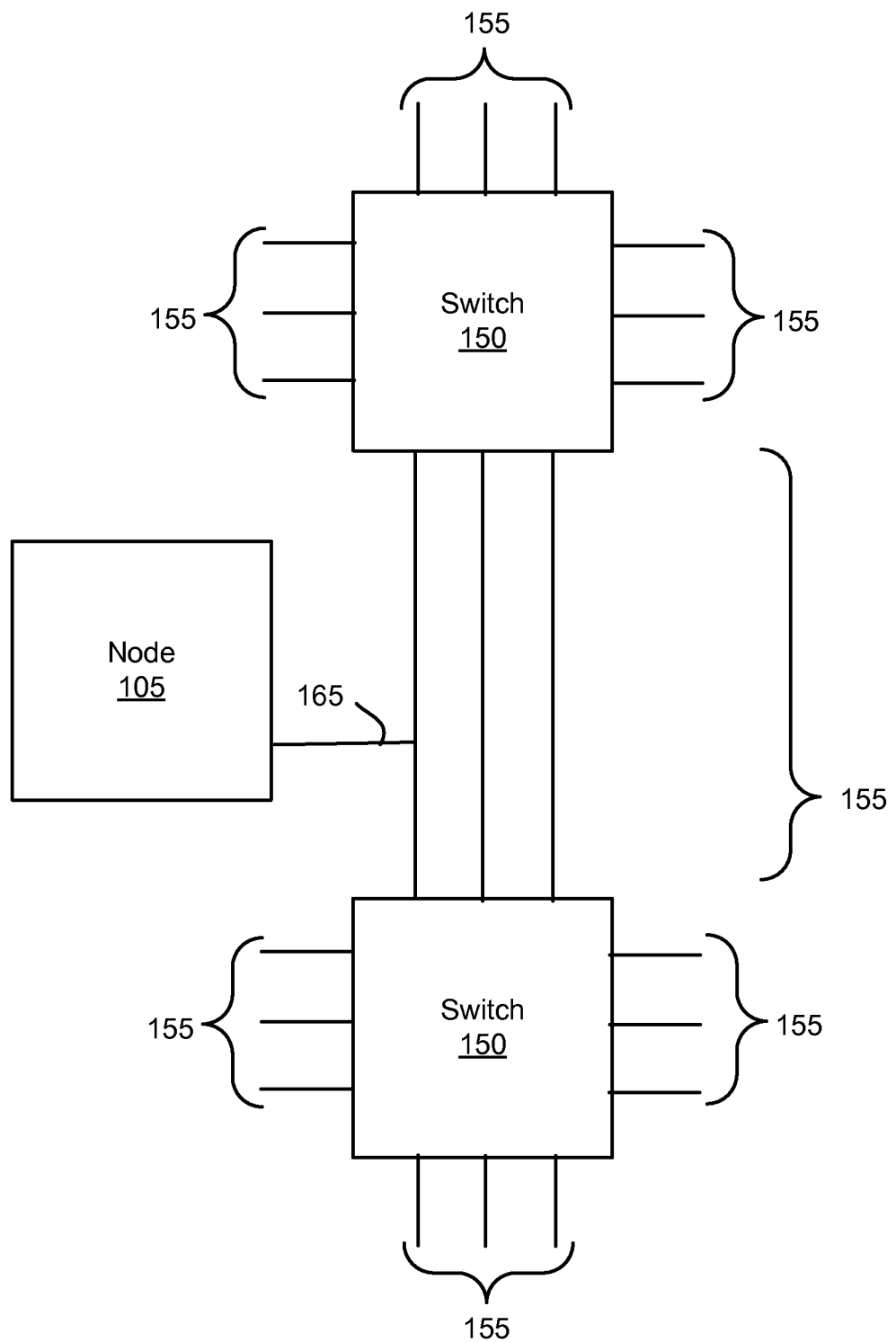
FIG. 1B is a schematic block diagram illustrating one embodiment of routing elements.

FIG. 1B is a schematic block diagram illustrating one embodiment of routing elements. A Node 105 may be connected to a path 155 at a node connection 165. Paths 155 connect nodes 105. Paths 155 may be routed through one or more switches 150. A subnet 115 may comprise one or more paths 155 and one or more routings through one or more switches 150 to one or more node connections 165.

In the routable system 100, multiple subnets 115 may be routed through an area of paths 155 and switches 150. As a result, the number of available paths 155 and/or routes through switch 150 may be exceeded. This may result in an obstacle. In addition, subnets 115 may make extensive use of the node connections 165, paths 155, and switches 150 in a particular area, resulting in a congested area where routing subnets 115 is difficult.

The paths 155, switches 150, and node connections 165 are referred to herein as the routing elements. Subnets 115 may be formed of one or more routing elements. In addition, the net 110 may be formed of combinations of routing elements.

Figure 1C:
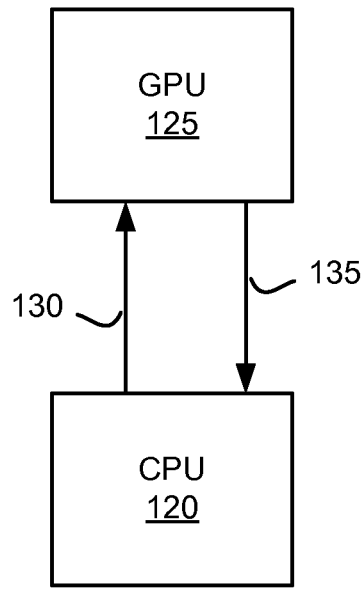
FIG. 1C is a schematic block diagram illustrating one embodiment of a global routing system.

FIG. 1C is a schematic block diagram illustrating one embodiment of a global routing system 101. The system 101 includes a CPU 120 and a GPU 125. The CPU 120 may route a net 110 of routing elements for a semiconductor design. The routing elements may specify connections between each of the nodes 105. In addition, the CPU 120 may decompose the net 110 into subnets 115 as will be described hereafter.

The CPU 120 may identify one or more congested regions of the routed net 110 that exceed routing capacities. The CPU 120 may correlate each congested region with a first plurality of subnets 115 with workloads within the congested region. A subnet 115 may have a workload within the congested region if routing elements of the subnet 115 are within the congested region. Alternatively, the subnet 115 may have a workload within the congested region if a node 105 in communication with the subnet 115 is within the congested region.

In addition, the CPU 120 may determine dependencies between the subnets 115 and group subnets 115 with dependencies into a group. The CPU 120 may queue each group to one graphic processor of the GPU 125. The CPU 120 may communicate groups of subnets 115 to the GPU 125 for routing.

The CPU 120 communicates with the GPU 125 through an uplink 130. The uplink 130 communicates groups of subnets 115 from the CPU 120 to the GPU 125 for routing.

The GPU 125 may route the subnets 115. In one embodiment, the GPU 125 routes the subnets 115 using multi-source, multi-sink maze routing. The subnets 115 of each group may be routed by one graphic processor of the GPU 125. Groups of subnets 115 may be routed in parallel by a plurality of graphic processors. Each group may be routed independently of each other group. In a certain embodiment, the graphic processor of the GPU 125 sequentially routes each subnet 115 in a group around an obstacle as will be described hereafter. In addition, the graphic processor may join each routed subnet 115 to a concurrent subnet 115 as will be described hereafter.

The GPU 125 communicates with the CPU 120 through a downlink 135. The downlink 135 communicates routed subnets 115 from the GPU 125 to the CPU 120. The uplink 130 and the downlink 135 may be dedicated electrical buses.

Figure 2A:
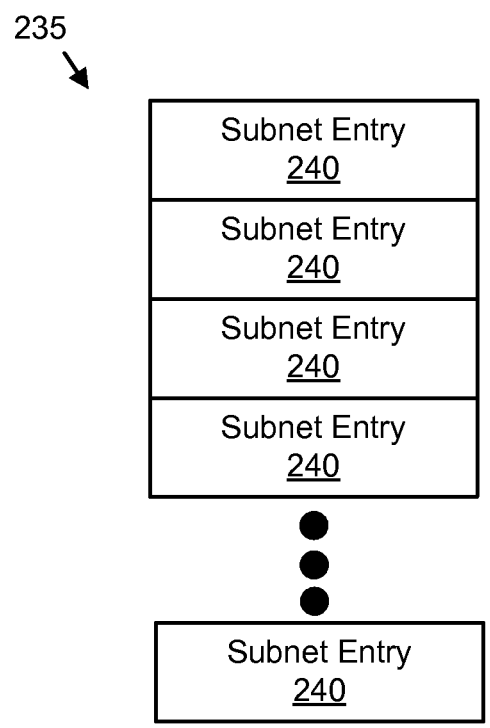
FIG. 2A is a schematic block diagram illustrating one embodiment of net data.

FIG. 2A is a schematic block diagram illustrating one embodiment of net data 235. The net data 235 may be organized as a data structure in a memory. The net data 235 may describe the net 110. In the depicted embodiment, the net data 235 includes subnet entries 240 for a plurality of subnets 115 in the net 110.

In one embodiment, the net 110 describes all routing elements for a semiconductor design. The net 110 may initially utilize more paths 155, switches 150, and node connections 165 than are available in the routable system 100. Alternatively, the net 110 may describe communication channels between nodes 105. The communication channels may logically connect one or more nodes 105 without specifying the routing elements that connect the nodes 105. In one embodiment, the net 110 may include combinations of routing elements and communication channels.

Figures 2B, 2C:
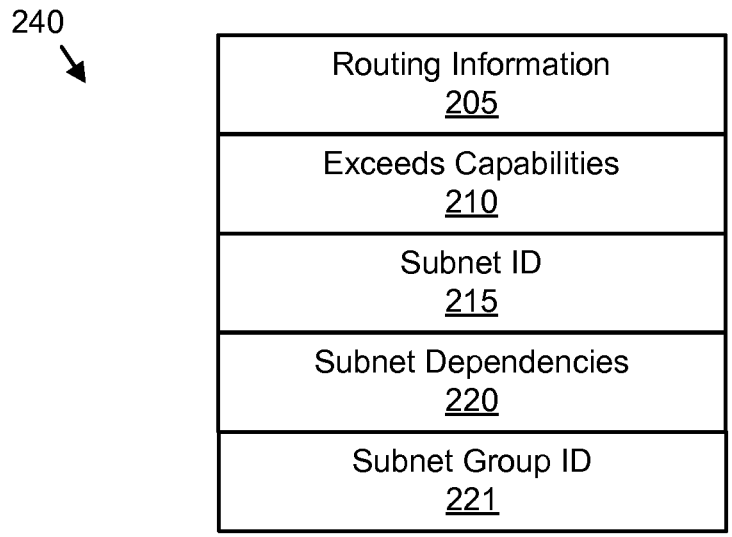
FIG. 2B is a schematic block diagram illustrating one embodiment of a subnet entry.
FIG. 2C is a schematic block diagram illustrating one embodiment of subnet dependencies.

FIG. 2B is a schematic block diagram illustrating one embodiment of a subnet entry 240. Each subnet entry 240 may describe a subnet 115 in the net data 235. The subnet entry 240 may be organized as a data structure in the memory. Pointers for each subnet entry 240 may be passed between the CPU 120 and the GPU 125. Alternatively, subnet entries 240 may be passed between the CPU 120 and the GPU 125. In the depicted embodiment, the subnet entries 240 include a subnet identifier 215, routing information 205, exceeds capabilities information 210, subnet dependencies information 220, and a subnet group identifier 221.

The subnet identifier 215 identifies a unique subnet 115. The subnet identifier 215 may be an arbitrarily assigned index.

The routing information 205 may describe a current routing of the subnet 115. Initially, the routing information 205 may describe communication channels between nodes 105. Alternatively, the routing information 205 may include a complete listing of routing elements for the subnet 115. The routing information 205 may include a final routing for the subnet 115 after a graphic processor 435 has routed the subnet 115.

The exceeds capabilities information 210 may indicate that the subnet 115 is routed through a congested region. A congested region may be a region of the routable system 100 where the density of subnets 115 exceeds a specified congestion threshold. Alternatively, the congested region may be a region of the routable system 100 where the utilization of routing elements exceeds the specified congestion threshold.

In one embodiment, the exceeds capability information 210 specifies the routing elements of an obstacle. Alternatively, the exceeds capability information 210 may specify a region of the routable system 100.

The subnet dependencies 220 may record each other subnet 115 with which the current subnet 115 shares a dependency. The dependency may be a node 105. Alternatively, the dependency may be one or more routing elements. The subnet dependencies 220 are described in greater detail in FIG. 2C.

FIG. 2C is a schematic block diagram illustrating one embodiment of subnet dependencies 220 for a subset entry 240. The subnet dependencies 220 maybe organized as a data structure in a memory. The subnet dependencies 220 record the subnet identifier 215 of each subnet 115 with which the current subnet 115 shares the dependency and the nodes 105 and/or routing element(s) 260 that create the dependency between the subnets 115.

Figure 2D:
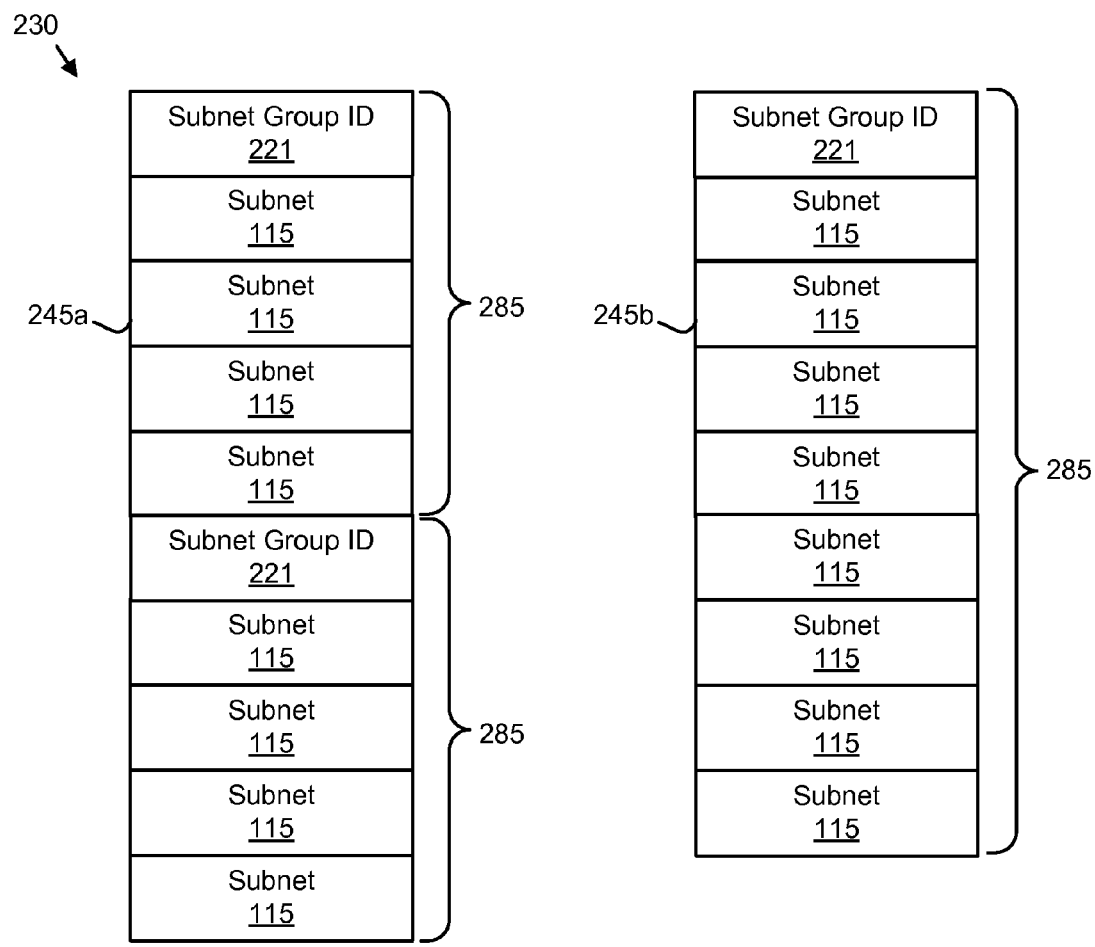
FIG. 2D is a schematic block diagram illustrating one embodiment of subnet queues.

FIG. 2D is a schematic block diagram illustrating one embodiment of subnet queues 230. The subnets 115 may be organized in multiple ordered queues 245. Each queue 245 may include one or more groups 285. In one embodiment, groups 285 are identified by a subnet group identifier 221. In one embodiment, the subnet entries 240 represent the subnets 115 in the ordered queues 245. Each queue 245 may be directed to a single graphics processor.

Figure 2E:
FIG. 2E is a schematic block diagram illustrating one embodiment of a resource data structure.

FIG. 2E is a schematic block diagram illustrating one embodiment of a resource data structure 270. The resource data structure 270 maybe organized as a data structure in a memory. In one embodiment, the resource data structure 270 is stored on the GPU 125. Alternatively, the resource data structure 270 may be stored in the CPU 120. In addition, the resource data structure 270 may be shared between the CPU 120 in the GPU 125.

The resource data structure 270 may include an entry for each routing element 260 in the routable system 100. The routing element 260 may be identified by an element identifier 275. A reserved status 280 may indicate whether the routing element 260 is reserved by a subnet 115. The subnet identifier 215 may record each subnet 115 that reserves the routing element 260.

Figure 3A:
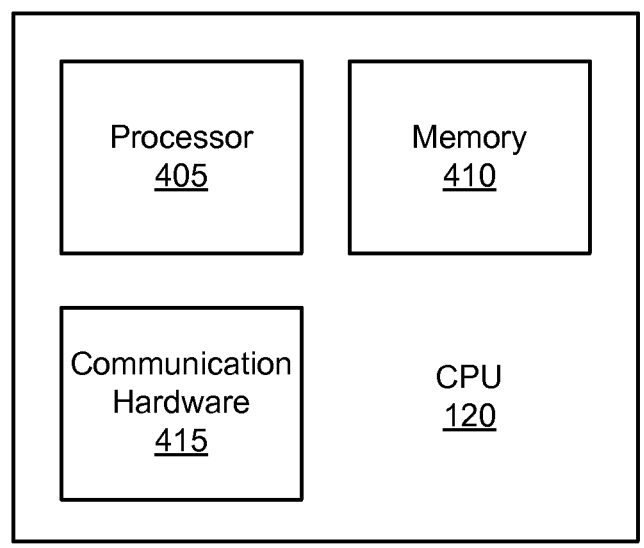
FIG. 3A is a schematic block diagram illustrating one embodiment of a central processing unit (CPU)

FIG. 3A is a schematic block diagram illustrating one embodiment of the CPU 120. The CPU 120 includes a processor 405, a memory 410, and communication hardware 415. The memory 410 may be a semiconductor memory, a hard disk drive, an optical storage device, a micromechanical storage device, or combinations thereof. The memory may store code and data such as the net data 235 and/or the ordered queues 245. The processor 405 may execute the code. The communication hardware 415 may communicate with other devices such as the GPU 125. In one embodiment, the communication hardware 415 communicates with the uplink 130 and the downlink 135.

Figure 3B:
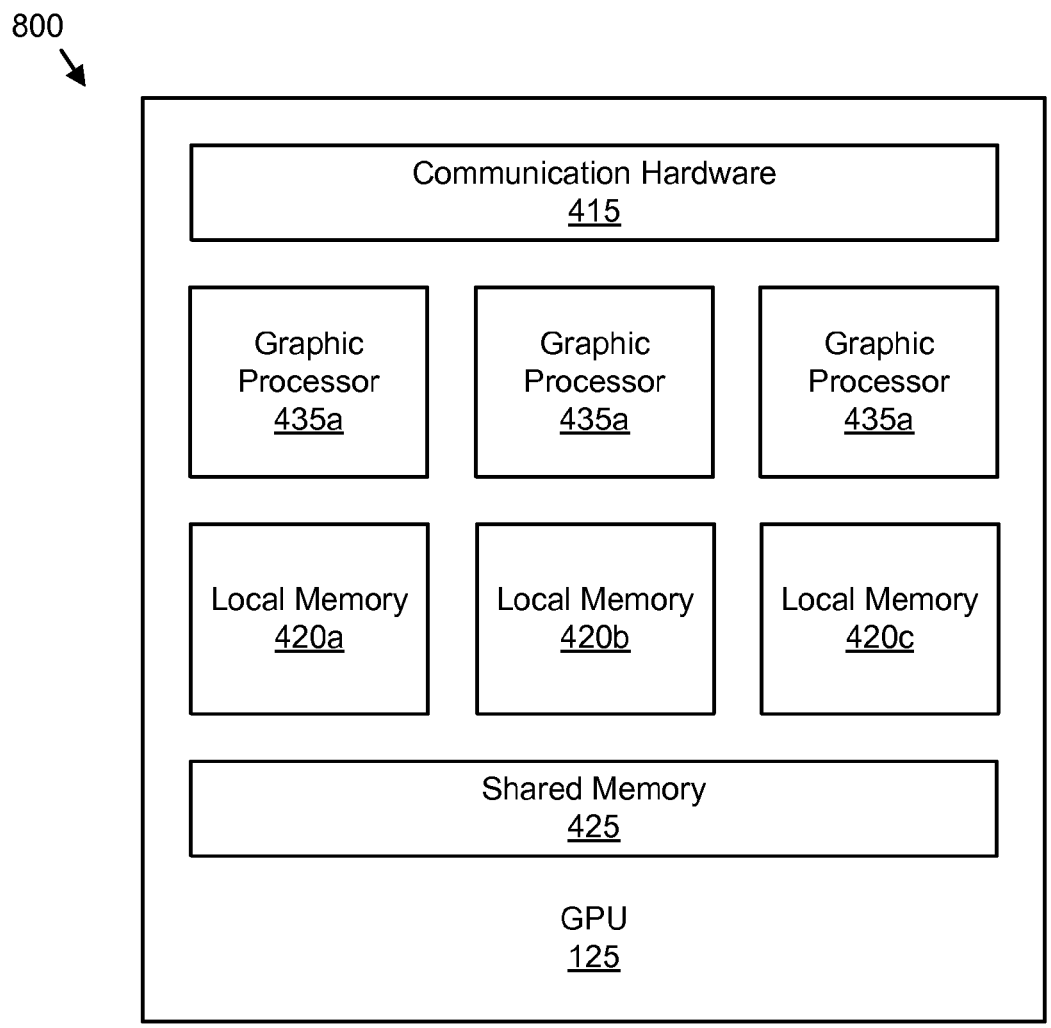
FIG. 3B is a schematic block diagram illustrating one embodiment of a GPU.

FIG. 3B is a schematic block diagram illustrating one embodiment of the GPU 125. The GPU 125 includes communication hardware 415, a plurality of graphic processors 435, a plurality of local memories 420, and a shared memory 425. The communication hardware 415 may communicate with other devices such as the CPU 120. In one embodiment, the communication hardware 415 communicates with the uplink 130 and the downlink 135.

The shared memory 425 and the local memories 420 may be semiconductor storage within the GPU 125. Alternatively, the shared memory 425 may communicate with the GPU 125 over a bus such as a dedicated bus.

Each local memory 420 may be associated with a graphic processor 435. The local memory 420 may store code and data for the graphic processor 435. The shared memory 420 may also store code and data for all the graphic processors 415.

In one embodiment, an ordered queue 245 and/or group 285 is communicated to each of the local memories 420 and routed by the associated graphic processor 435 as will be described hereafter. By organizing the net data 235 as groups 285 and/or ordered queues 245 that may be processed independently and in parallel by the graphic processors 435, the embodiments may route the routable system 100 with greater parallelization. As a result, the time required to route the routable system 100 is greatly reduced. The routed subnets 115 may further be communicated to the CPU 120 through the communication hardware 415.

Figure 4:
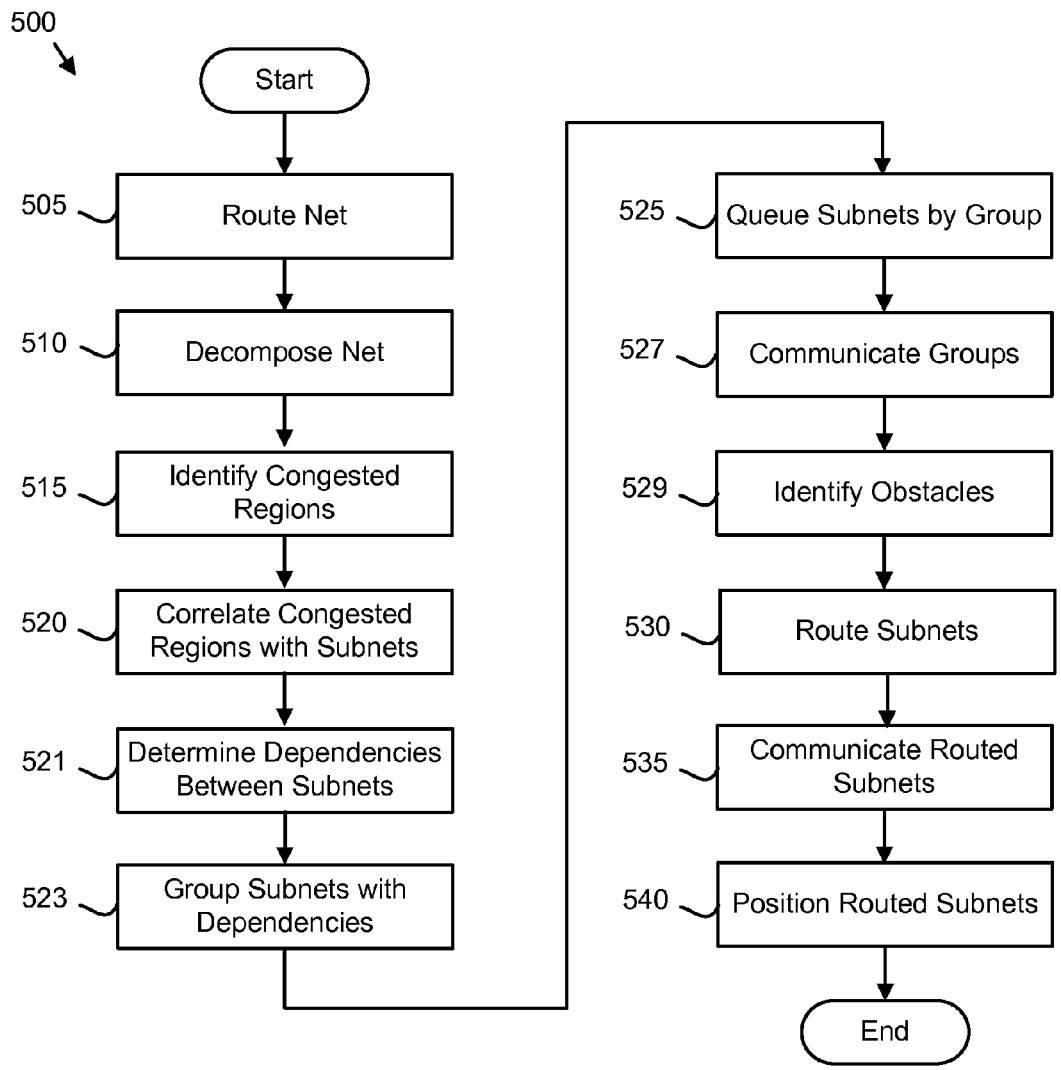
FIG. 4 is a schematic flow chart diagram illustrating one embodiment of a global routing method.

FIG. 4 is a schematic flow chart diagram illustrating one embodiment of a global routing method 500. The method 500 may be performed by the GPU 125 and the CPU 120. In one embodiment, the method 500 is performed using the processor 405 and/or graphic processors 435. The method 500 may be embodied in a program product. The program product may comprise a computer readable storage medium such as the memory 410, the local memories 420, and the shared memory 425. The computer readable medium may store code that when executed by a processor 405 and/or graphic processor 435 performs the functions of the method 500.

The method 500 starts, and in one embodiment, the CPU 120 routes 505 the net 110. In one embodiment, the CPU 120 routes 505 the net 110 to implement a specified semiconductor design on the routable system 100. In a certain embodiment, subnets 115 are allowed to share paths in order to route 505 the net 110. Alternatively, the number of paths 155 supported by the routable system 100 between switches 150 may be exceeded. In addition, the routing capacity of the switches 150 may be exceeded.

Alternatively, the net 110 may specify all the nodes 105 connected to a subnet 115. In one embodiment, one or more of the routing elements 260 may be left undefined. The nodes 105 and the communication channels between the nodes 105 may be identified by the net 110. The net 110 may identify communication channels between the nodes 105. For example, a first node 105 and the second node 105 may be connected by communication channel. Each communication channel may be implemented with a unique combination of routing elements 260.

The CPU 120 further decomposes 510 the net 110 into subnets 115. In one embodiment, each subnet 115 comprises node connections 165, paths 155, and/or switches 150 that connect two or more nodes 105. Each subnet 115 may have no shared paths 155. In addition, each subnet 115 may have no shared node connections 165 and/or routes through a switch 150. Each subnet 115 may carry specified communications between the nodes 105.

The CPU 120 further identifies 515 congested regions of the net 110 wherein the use of paths 155 and switches 150 exceed capabilities for the paths 155 and switches 150 of the routed system 100. In one embodiment, the subnets 115 in the congested region may exceed the congestion threshold. For example, more subnets 115 may be routed through a specified region than may be supported by paths 155 through the region. Alternatively, the utilization of routing elements 260 in the congested region may exceed the congestion threshold.

The CPU 120 may further correlate 520 the congested regions of the routed system 100 with subnets 115. In one embodiment, a description of the congested regions is recorded as exceeds capabilities information 210 in a subnet entry 240 for the subnet 115. The description of the congested region may describe node connections 165, paths 155, and/or switches 150 included in the congested region. In addition, the description of the congested region may include paths 155 and/or switches 150 that are adjacent to paths 155 and/or switches 150 in the congested region.

In one embodiment, the CPU 120 determines 521 dependencies between subnets 115. Two or more subnets 115 that share a node 105 may be dependent. The dependencies may be recorded in the subnet dependencies 220 for each subnet 115.

In one embodiment, the CPU 120 groups 523 the subnets 115 into groups 285 based on the dependencies between the subnets 115. In one embodiment, each group 285 of subnets 115 includes all subnets 115 with which each subnet 115 in the group 285 shares a dependency. Thus there are no subnets 115 with a dependency on a subnet 115 that is not in the group 285. In one embodiment, a group 285 of subnets 115 may be routed independently from the subnets 115 in all other groups 285.

Alternatively, one or more specified subnets 115 may be excluded from a group although they share subnet dependencies 220 with subnets 115 in the group 285. For example, one or more specified subnets 115 may be designated as bus subnets 115. The bus subnets 115 may be excluded from one or more groups 285.

In one embodiment, a subnet 115 may be included in one or more groups 285. The CPU 120 may divide a group of subnets 115 into two or more groups 285 with one or more subnets 115 common between the groups 285. The resource data structure 270 may track the relationship between the groups 285.

The subnet entry 240 for each subnet 115 may be updated with the subnet group identifier 221 for each group 285 that the subnet 115 belongs to. Each time a group 285 is created, a subnet group identifier 221 may be arbitrarily created for the group 285. In one embodiment, the subnet group identifier 221 is encoded with the desired area of the routable system 100 for locating the group 285.

The CPU 120 may queue 525 each group 285 for routing by a graphics processor 435. The CPU 120 may first queue 525 groups 285 that are likely to be difficult to route. In one embodiment, larger groups 285 are queued before smaller groups 285. Alternatively, groups 285 that include subnets 115 connecting to I/O modules may be queued before groups 285 without subnets 115 that connect to I/O modules.

The CPU 120 may communicate 527 the ordered queues 245 and/or groups 285 of subnets 115 over the uplink 130 to the GPU 125. The GPU 125 may assign each of the ordered queues 245 to a graphic processor 435. Alternatively, the GPU 125 may assign each group 285 to a graphic processor 435. In one embodiment, the GPU 125 may balance the groups 285 between graphic processors 435. The complexity of the subnet dependencies 220 of each group 285 may be balanced between the graphic processors 435.

The shared memory 425 may maintain the resource data structure 270 of all the routing elements 260 including paths 155, switches 150, and node connections 165 in the routable system 100. Each graphic processor 435 may store a group 285 of subnet entries 240 in the local memory 420 associated with a graphic processor 435. A graphic processor 435 may reserve one or more routing elements 260 from the shared memory 425 to route 530 the group 285 of subnet entries 240 as will be described hereafter.

The GPU 125 may identify 529 obstacles to routing the subnets 115. In one embodiment, an obstacle may be combinations of routing elements 260 that preclude routing the subnets 115 through the obstacle. Alternatively, the obstacle may be specified as design constraint.

The GPU 125 may route 530 the subnets 115 using the graphic processors 435. The graphics processors 435 may each concurrently route 530 a group 285 of subnets 115.

In one embodiment, each subnet 115 is routed 530 using multi-source, multi-sink maze routing by a graphic processor 435. The graphic processor 435 may sequentially route 530 each subnet 115 in a group 285 around an obstacle. The graphic processor 435 may route 530 each subnet 115 in an order of the queue 245 and/or group 285. In addition, the graphic processor 435 may join each routed subnet 115 to a concurrent subnet 115 to complete the routing 530 of the subnet 115. The routing 530 of the subnets 115 is described in more detail in FIGS. 5A-D.

In one embodiment, the GPU 125 communicates 535 the routed subnets 115 over the downlink 135 to the CPU 120. The CPU 120 may position 540 the routed subnets 115 to connect to the net 110 and the method 500 ends. Alternatively, the GPU 125 may position 540 the routed subnets 115 to connect to the net 110 and communicate 535 the connected subnets 115 over the downlink 135 to the CPU 120.

Figure 5A:
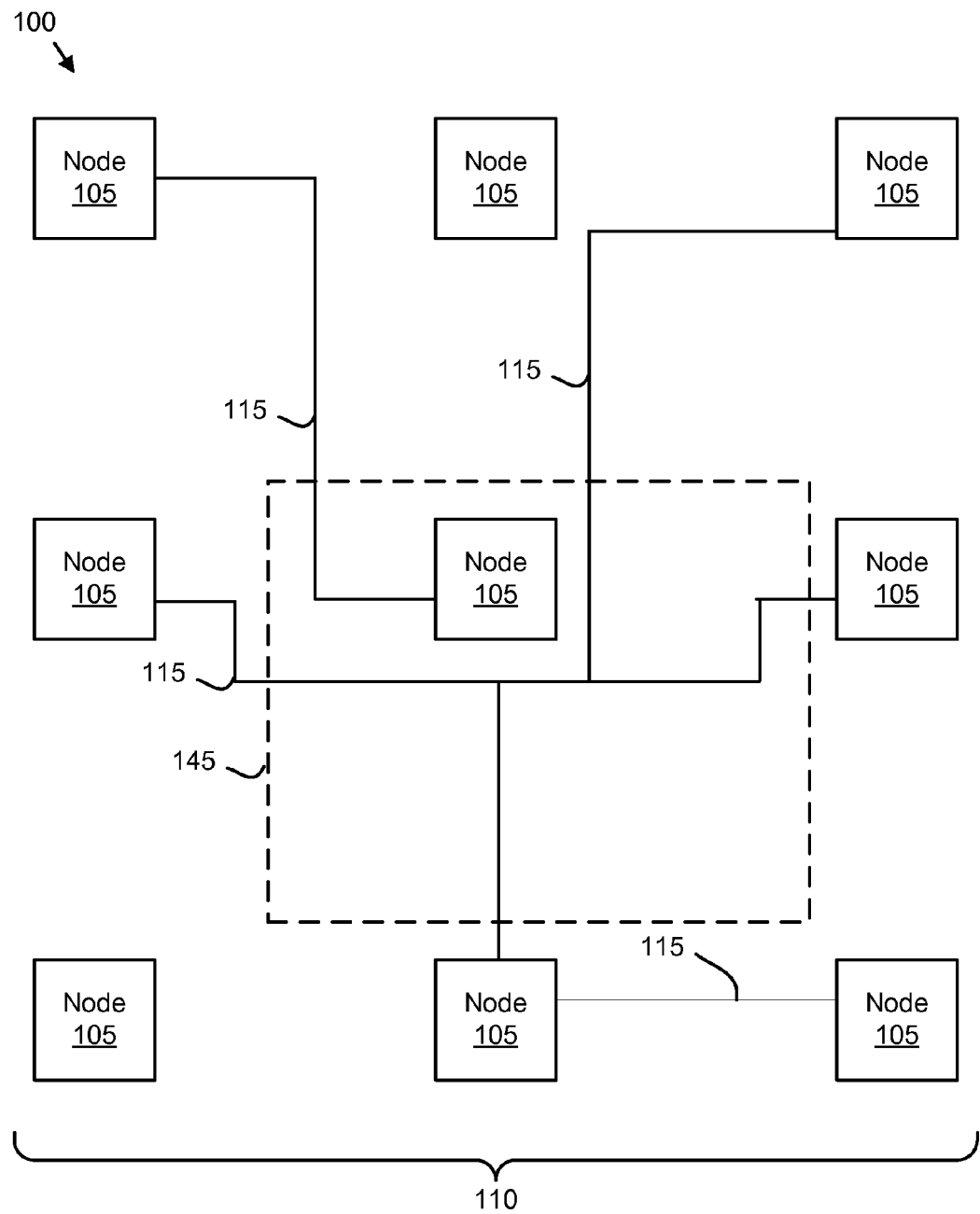
FIG. 5A is a schematic flow chart diagram illustrating one embodiment of routing.

FIG. 5A is a schematic flow chart diagram illustrating one embodiment of routing. The routable system 100 of FIG. 1A is shown. In the depicted embodiment, the net 110 is decomposed into subnets 115. In addition, a congested region 145 is identified. In one embodiment, the paths 155, switches 150, and/or node connections 165 within the congested region 145 are insufficient for the subnets 115 to be routed within the congested region 145. The congested region 145 may be recorded in the exceeds capabilities information 210 for each subnet 115 that may route through the congested region 145.

Figure 5B:
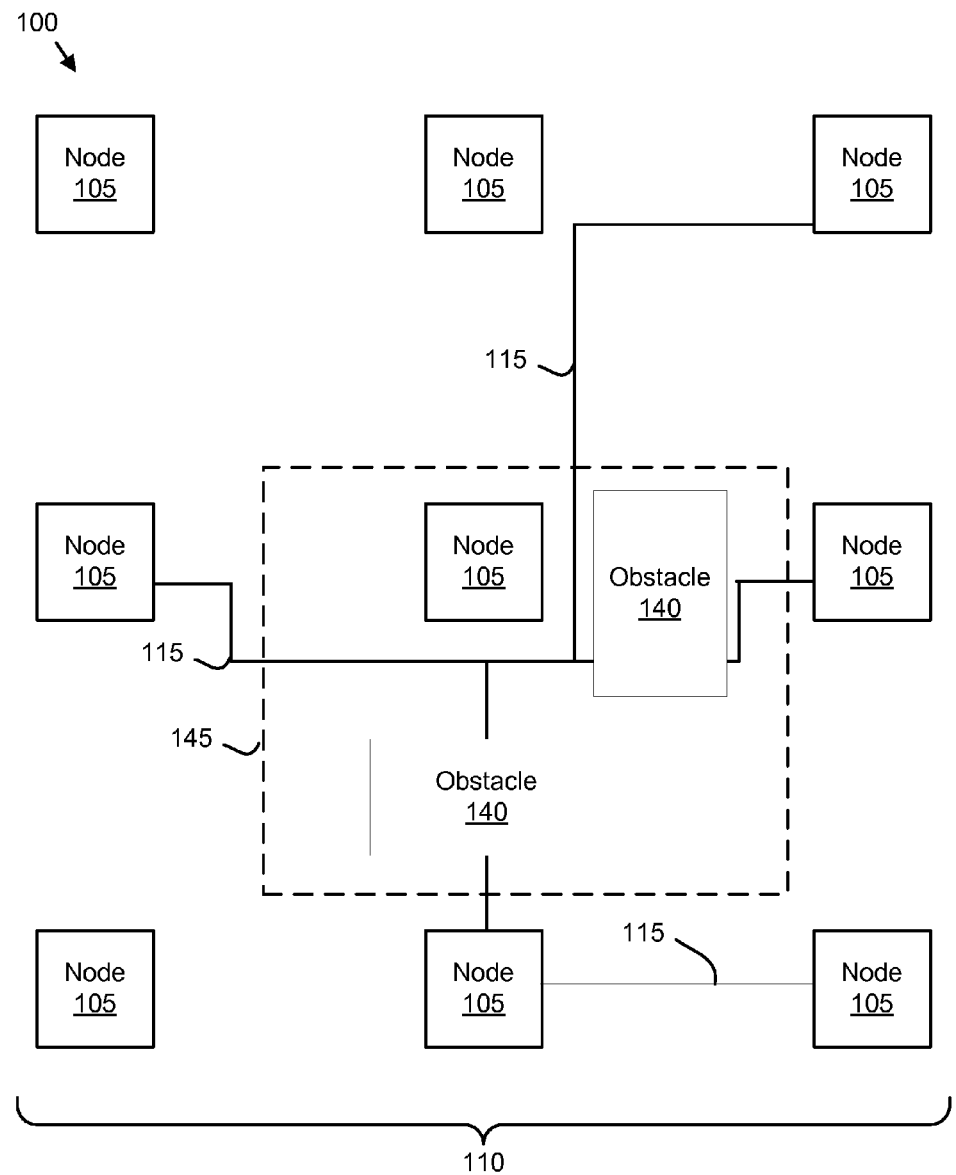
FIG. 5B is a schematic flow chart diagram illustrating one embodiment of routing.

FIG. 5B is a schematic flow chart diagram illustrating one embodiment of routing. Continuing the example of FIG. 5A, a group 285 of the subnets 115 is shown. In addition, obstacles 140 are identified. The obstacles 140 may be identified within the congested region 145. In one embodiment, sufficient routing elements 260 are reserved within the obstacle 140 to prevent other subnets 115 from being routed through the obstacle 140. The obstacle 140 may comprise one or more groups of subnets 115, custom design elements, and the like.

Figure 5C:
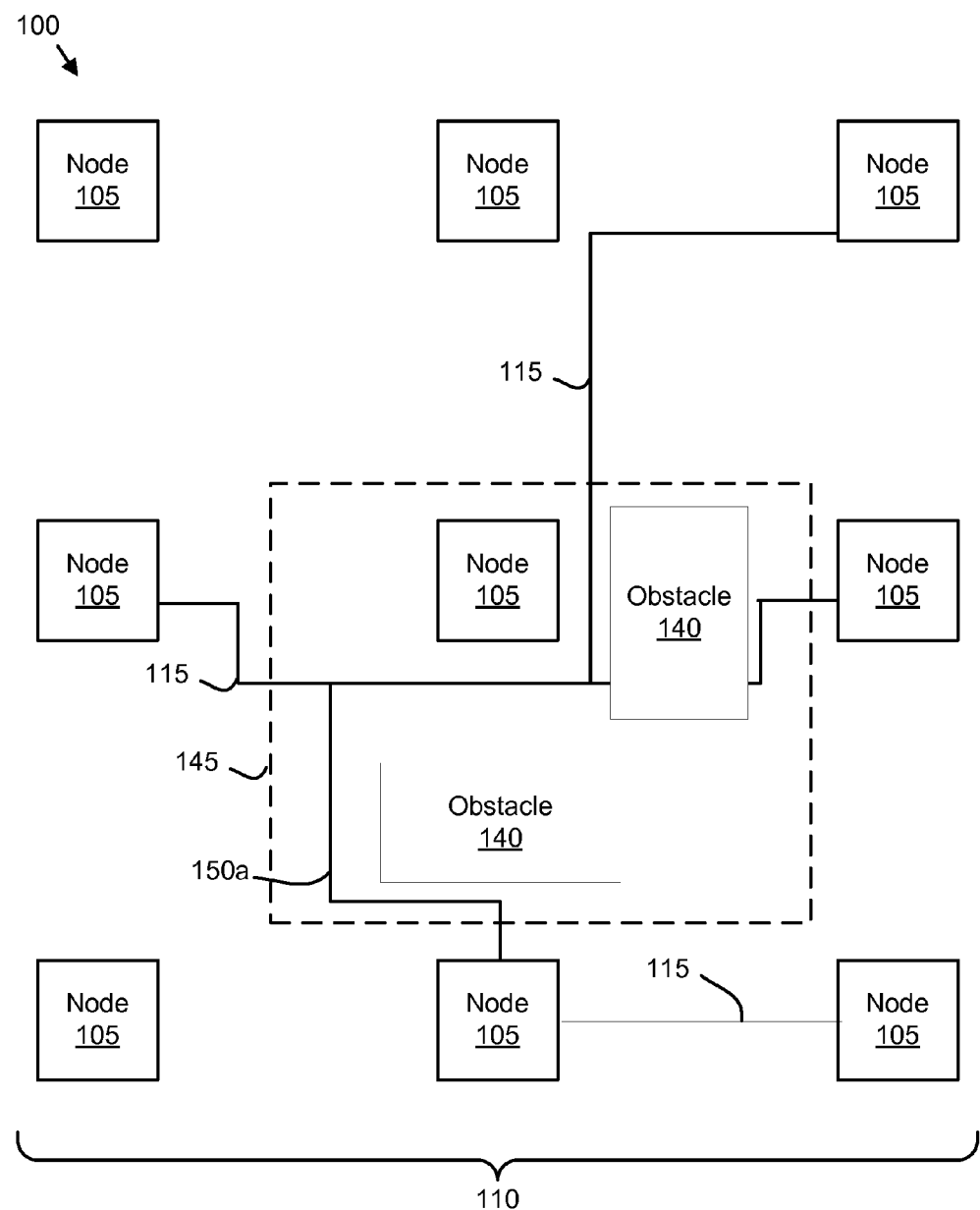
FIG. 5C is a schematic flow chart diagram illustrating one embodiment of routing.

FIG. 5C is a schematic flow chart diagram illustrating one embodiment of routing. The example of FIG. 5B is continued, with a graphics processor 435 sequentially routing each subnet 115 of the group 285 of subnets 115 around the obstacles 140. A graphics processor 435 may route each subnet 115 in a group around the obstacles 140 independent of and in parallel with the routing of other graphic processors 435 of the subnets 115 of other groups 285. Thus the GPU 125 is able to concurrently route 530 multiple groups 285 of subnets 115, greatly accelerating the routing of the net 110.

Figure 5D:
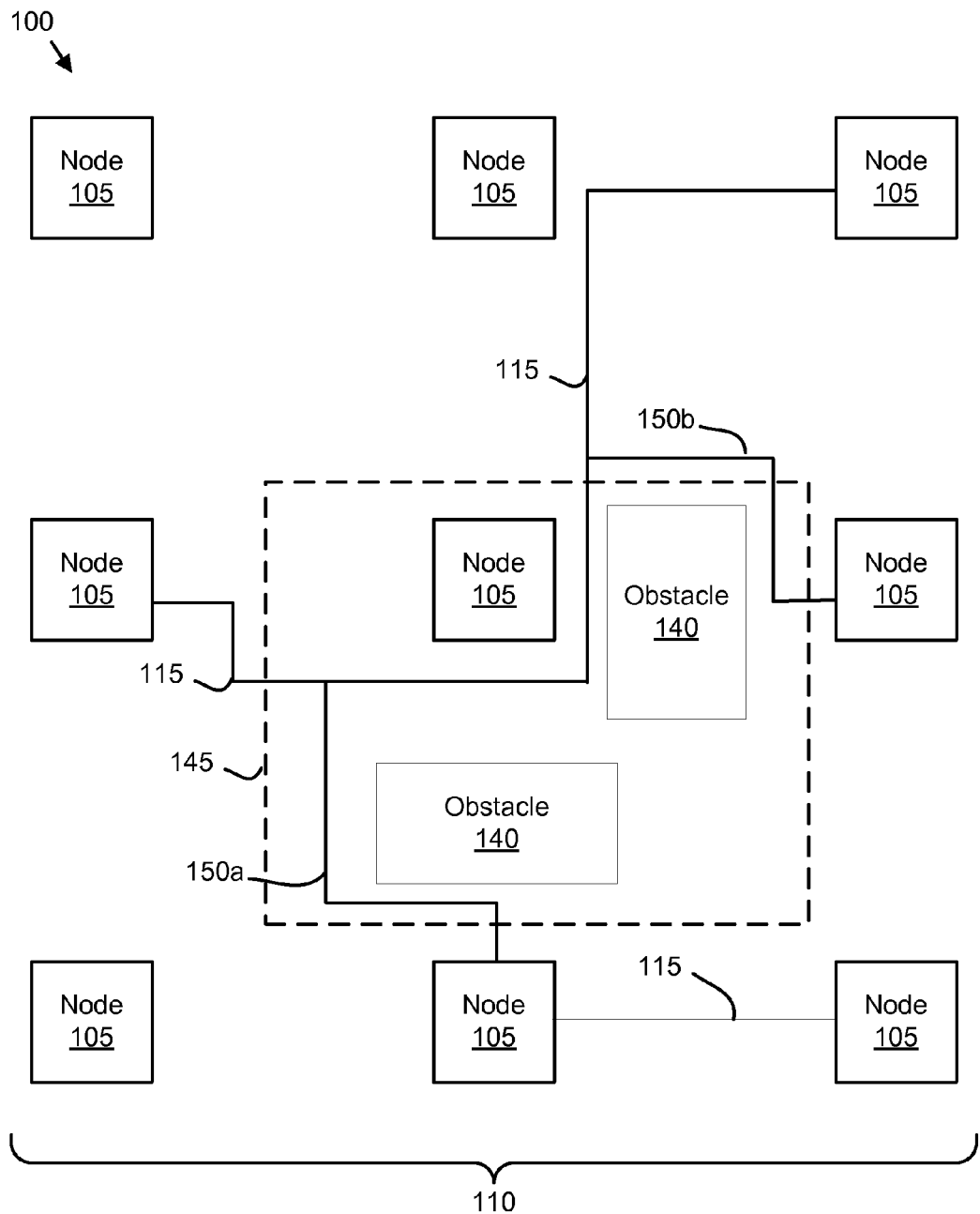
FIG. 5D is a schematic flow chart diagram illustrating one embodiment of routing.

FIG. 5D is a schematic flow chart diagram illustrating one embodiment of routing. Continuing the example of FIG. 5C, each subnet 115 is joined to a concurrent subnet 150. In one embodiment, joining the subnet 115 to a concurrent subnet 150 completes the routing of the subnet 115. The routed subnets 115 may be positioned to connect to the net 110.

By parallelizing the routing of the subnets 115, the embodiments greatly accelerate the global routing of a design as the net 110. The identification of the congested region 145 and the correlating of the congested region 145 with a group 285 of a plurality of first subnets 115 with workloads within the congested region 145 supports the independent routing of each group 285 in parallel using a graphics processor 435. As a result, the routing process is greatly accelerated.

Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for improving global routing comprising:
   routing, by use of a processor, a net of node interconnections for a semiconductor design, wherein each routing element of the node interconnections comprises a reserved status that indicates if the routing element is reserved for a subnet;
   decomposing the net into subnets wherein each subnet has no shared paths;
   identifying a congested region of the routed net that exceeds routing capacities;
   correlating the congested region with a plurality of first subnets with workloads within the congested region;
   determining dependencies between the plurality of first subnets, wherein two or more subnets that share a node are dependent;
   designating bus subnets;
   grouping subnets of the plurality of first subnets with dependencies into at least one group, wherein each subnet in each group shares a dependency and bus subnets are excluded from the at least one group;
   identifying an obstacle within the congested region for a given subnet;
   reserving routing elements within the obstacle for the given subnet using the reserved status; and
   routing the subnets in parallel using a graphics processing unit (GPU) wherein reserved routing elements are only used to route the given subnet.

2. The method of claim 1, wherein the GPU routes the subnets using multi-source, multi-sink maze routing.

3. The method of claim 1, the method further comprising queuing each group of the at least one group to one graphic processor of the GPU.

4. The method of claim 3, wherein the GPU routes the subnets by:
   sequentially routing each subnet except the given subnet around the obstacle; and
   joining each routed subnet to a concurrent subnet.

5. The method of claim 1, the method further comprising positioning the routed subnets to connect to the net.

6. The method of claim 1, wherein the GPU communicates with a central processing unit (CPU) through an uplink that communicates workload data from the CPU to the GPU for routing and a downlink that communicates routed paths of the net from the GPU to the CPU.

7. A program product for improving global routing comprising a non-transitory computer readable storage medium that stores code executable by a processor to perform:
   routing a net of node interconnections for a semiconductor design, wherein each routing element of the node interconnections comprises a reserved status that indicates if the routing element is reserved for a subnet;
   decomposing the net into subnets wherein each subnet has no shared paths;
   identifying a congested region of the routed net that exceeds routing capacities;
   correlating the congested region with a plurality of first subnets with workloads within the congested region;
   determining dependencies between the plurality of first subnets, wherein two or more subnets that share a node are dependent;
   designating bus subnets;
   grouping subnets of the plurality of first subnets with dependencies into at least one group, wherein each subnet in each group shares a dependency and bus subnets are excluded from the at least one group;
   identifying an obstacle within the congested region for a given subnet;
   reserving routing elements within the obstacle for the given subnet using the reserved status; and
   routing the subnets in parallel using a graphics processing unit (GPU) wherein reserved routing elements are only used to route the given subnet.

8. The program product of claim 7, wherein the GPU routes the subnets using multi-source, multi-sink maze routing.

9. The program product of claim 7, the processor further performing
   queuing each group of the at least one group to one graphic processor of the GPU.

10. The program product of claim 9, wherein the GPU routes the subnets by:
    sequentially routing each subnet except the given subnet around the obstacle; and
    joining each routed subnet to a concurrent subnet.

11. The program product of claim 7, the processor further positioning the routed subnets to connect to the net.

12. The program product of claim 7, wherein the GPU communicates with a central processing unit (CPU) through an uplink that communicates workload data from the CPU to the GPU for routing and a downlink that communicates routed paths of the net from the GPU to the CPU.

13. An apparatus for improving global routing comprising:
    a central processing unit (CPU);
    a graphics processing unit (GPU)
    a memory that stores code executable by one or more of the processing units to:
    route a net of node interconnections for a semiconductor design, wherein each routing element of the node interconnections comprises a reserved status that indicates if the routing element is reserved for a subnet;
    decompose the net into subnets wherein each subnet has no shared paths;
    identify a congested region of the routed net that exceeds routing capacities;
    correlate the congested region with a plurality of first subnets with workloads within the congested region;
    determine dependencies between the plurality of first subnets, wherein two or more subnets that share a node are dependent;
    designating bus subnets;
    group subnets of the plurality of first subnets with dependencies into at least one group, wherein each subnet in each group shares a dependency and bus subnets are excluded from the at least one group;
identifying an obstacle within the congested region for a given subnet;
reserving routing elements within the obstacle for the given subnet using the reserved status; and
route the subnets in parallel using the GPU, wherein reserved routing elements are only used to route the given subnet.

14. The apparatus of claim 13, wherein the GPU routes the subnets using multi-source, multi-sink maze routing.

15. The apparatus of claim 13, the processing units further queuing each group of the at least one group to one graphic processor of the GPU.

16. The apparatus of claim 15, wherein the GPU routes the subnets by:
sequentially routing each subnet except the given subnet around the obstacle; and
joining each routed subnet to a concurrent subnet.

17. The apparatus of claim 13, the processing units further positioning the routed subnets to connect to the net.

* * * * *